United States Patent [19]
Chen et al.

[11] Patent Number: 5,995,418
[45] Date of Patent: *Nov. 30, 1999

[54] CIRCUIT AND METHOD FOR ERASING FLASH MEMORY ARRAY

[75] Inventors: Kou-Su Chen; David K. Y. Liu, both of Fremont, Calif.

[73] Assignee: AMIC Technology, Inc., Santa Clara, Calif.

[*] Notice: This patent is subject to a terminal disclaimer.

[21] Appl. No.: 09/251,040

[22] Filed: Feb. 18, 1999

Related U.S. Application Data

[63] Continuation of application No. 08/988,872, Dec. 11, 1997.
[51] Int. Cl.[6] ................................................. G11C 16/04
[52] U.S. Cl. .................... 365/185.29; 365/185.3; 365/185.33; 365/185.24
[58] Field of Search ........................ 365/185.29, 185.3, 365/185.33, 185.22, 185.24

[56] References Cited

U.S. PATENT DOCUMENTS

| | | | |
|---|---|---|---|
| 5,132,935 | 7/1992 | Ashmore, Jr. | 365/218 |
| 5,600,593 | 2/1997 | Fong | 365/185.19 |

*Primary Examiner*—Trong Phan
*Attorney, Agent, or Firm*—Law+

[57] ABSTRACT

A circuit and method for achieving compressed distributions of erased cell threshold voltages in an EEPROM array is disclosed. The invention, when used to condition flash memory cell arrays, results in increased endurance of such arrays, and eliminates the need for pre-programming operations before a bulk erase can take place. By eliminating the need to pre-program the memory array before each erasure, the process provides a signicant improvement for low power applications, because battery life is extended and write cycle time is enhanced.

48 Claims, 8 Drawing Sheets

CIRCUIT AND METHOD FOR ERASING FLASH MEMORY ARRAY

This application is a continuation of copending application Ser. No. 08/988,872 filed on Dec. 11, 1997.

FIELD OF THE INVENTION

The present invention relates to a circuit and method for erasing a flash memory array so that voltage threshold distributions of cells in the array are tightened (made more uniform) and unnecessary harsh programming of cells is eliminated- The invention is particularly useful for flash EEPROM arrays because program and erase cycles are minimized, thus requiring less power and leading to longer life for such products.

BACKGROUND OF THE INVENTION

In a typical non-volatile flash EEPROM (or EAROM) a memory array is usually erased by erasing an entire block of memory cells. The memory cells are organized alone a number of word lines and a number of bit lines. The memory array contains data denoted as '1' and '0', which values are determined by the threshold voltage of the particular cell in question. As is well known, the threshold voltage of the cell, in turn, is determined by the amount of charge stored on the floating gate, which charge therefore dictates the state of the core cell. Accordingly, the data in the core transistor of the flash EEPROM cell is read as a '1' if the core transistor is at an 'on' state, and such data is similarly read as a '0' if the core transistor is at an 'off' state.

A core transistor in the non-volatile flash EEPROM is considered at its 'on' state if the transistor conducts more core cell current than a reference core cell transistor, whereas the core transistor is considered at its 'off' state if it conducts less core cell current than the reference core cell transistor. The amount of current conducted by the core transistor is a direct function of the amount of charge stored on the floating gate, and this in turn affects the turn-on voltage. A number of different operations during normal use of a flash memory cell will affect the charge on the floating gate, and for this reason a substantial amount of effort is made to ensure that such operations effectuate the proper response from such cell (i.e., that a predictable and proper amount of charge remains on such gate after such operation).

One of these typical steps in the use of a flash cell array is an "erase" operation. The purpose of this step is to remove charge from the floating gates, and thus place them into a "1" data state condition. It is very critical to control the threshold voltage distribution in the non-volatile flash EEPROM after each erase operation, since the memory array may be "over" erased; this means that the core cell transistor exhibits a negative threshold voltage. It is apparent that if the flash memory array experiences over-erasure, erroneous data may be retrieved from the memory array. Furthermore, it is even conceivable that the entire non-volatile flash memory may be no longer operated reliably if the floating gate of the cell has so deteriorated that it can no longer acquire meaningul differences in charge so that the difference between an 'on' state and an 'off' state can be detected. This can be true if the cell is extremely leaky, i.e., in the sense that it cannot hold charge. In other cases it is possible that it will render a substantial amount of other cells unusable because it will conduct so much current that it will swamp the "on" current of adjoining cells and make them essentially irrelevant.

Correction of over-erased cells in a non-volatile flash EEPROM, therefore, is a far more critical operation than most because over-erased cells not only cause erratic operation on the said flash memory array, they also greatly reduce the number of times the core array may be re-programmed. Preventing the occurence of over-erased cells in a non-volatile flash memory is therefore extremely desirable; as a corrolary to this, of course, it is apparent that excessive use of embedded erase algorithms should be avoided whenever possible.

To prevent over-erasure, prior art systems have employed a mechanism as shown generally in FIG. 1B. Instead of applying a single "erase" pulse, which might drive a large number of the voltage thresholds of the lower group of cells into an over-erase condition, a first "program" operation is instead effectuated on the entire array. This has the effect of moving all the threshold voltages into the area generally bounded by $Vt_{pmin}$ and $Vt_{pmax}$. Then, a second "erase" operation has the effect of placing the threshold voltages of the cells into the area bounded by $Vt_{emin}$ and $Vt_{emax}$. This procedure is not perfect, however, and a significant number of cells can still end up being over-erased as shown by the dotted line portion of FIG. 1B. These cells, in turn, must be identified, and, if any are found to exist, an erase correction pulse is applied to rectify the threshold voltages. In any event, it is apparent that the above methodology is non-optimal since it requires that the array be first programmed before an erase procedure can occur, and this stressing cycle exacts a toll on the lifespan of a part incorporating such array.

SUMMARY OF THE INVENTION

An object of the present invention, therefore, is to provide a circuit and method of erasing cells in a flash memory array that reduces the need for programming operations in such array, so that electrical stresses on such cells are reduced, and the reliability and operational lifespan of such array can be correspondingly improved;

Another object of the present invention is to provide a circuit and method of erasing flash memory cells so that threshold voltage distributions of such cells are tightened, thereby increasing the functional performance of devices using such cells;

Yet another object of the present invention, is to provide a circuit and method of erasing cells in a flash memory array that reduces power requirements so that such arrays can be used in a wider range of operating environments, including low power battery applications;

Yet another object of the present invention is to provide a circuit and method of adjusting the threshold voltage distributions of over-erased flash memory cells without resorting to a typical and electrically stressful "program" operation, so that the reliability and lifespan of such cells is significantly increased.

These and other objects are achieved by the present invention which adopts a two-part approach to the control of threshold voltage distributions in a flash memory cell array. During a first phase of a first routine, the existence of any over-erased cells is detected. Over-erased cells have a threshold voltage below a threshold voltage $Vt_{emin}$, where $Vt_{emin}$ is a minimum target threshold value for a cell in an erased state. If any such cells are discovered, a first threshold adjustment voltage signal is used during a second phase of the first routine to adjust (correct) threshold voltages of such cells, so that threshold voltages for any of them are pushed into a distribution above a controllable voltage $Vt_{sp}$, which voltage is above $Vt_{emin}$ but below $Vt_{emax}$ (where $Vt_{emax}$ is a maximum target threshold voltage value for a cell in an erased state). During a second routine, the existence of any under-erased cells is detected during a first phase; under-erased cells have a threshold voltage greater than $Vt_{sp}$. Only if any such under-erased cells are found is an erase pulse applied to the entire array. This feature of the present invention is substantially unlike that of the prior art, which always generates a program pulse first to move all the cells into a program state before moving them back to an erased state. After any erase pulse, a convergence cycle is executed which has the effect of adjusting the threshold voltages again of any over-erased cells in a manner analogous to that performed during the first routine. In this way, the distribution of threshold voltages in the arrays is dynamically and continually compressed or tightened.

In this fashion, the distribution of threshold voltages of cells in a flash memory array is carefully controlled, and is kept in such state without an undue amount of write cycling of such cells—i.e., excessive programming and erasing pulses. The adjustment pulses are also unlike prior art programming pulses, in that they are intended to move the threshold voltages into a non-overerased state, and not a fully programmed state in the conventional sense.

An integrated circuit can be manufactured in accordance with the present teachings to include an array of flash memory cells, conventional peripheral support circuitry for such array—including a power supply, row and column address decoders, erase and program pulse generators, a number of sense amplifiers, input/output buffers and a reference cell array—and a control circuit for adjusting the threshold voltages of the cells. The control circuit is configured (i.e., includes an embedded executable program) so that it implements the routines discussed above.

DETAILED DESCRIPTION OF THE INVENTION

From a high level perspective, the present invention utilizes two basic processes to control flash memory array cell threshold voltage (Vt) distribution. The first of these, incorporated in what is generally referred to as an over-erase routine, is described in two flow charts depicted in FIG. 3A and FIG. 3B. The second is incorporated in what is referred to generally as an under-erase routine, and is similarly depicted in flow chart form in FIG. 4A and FIG. 4B. These routines operate to cycle flash core cells of the type shown in FIG. 5, where it can be seen that each such cell includes a drain and source region (denoted as D and S), respectively, a control gate denoted as Vcg, and a floating gate FG. A first smaller P-WELL encloses the core transistor as a substrate, and this well is enclosed by a first N-WELL which is used as an isolation region between a P type substrate P-SUB and the first P-WELL. A first input terminal supplies a voltage signal Vp through heavily doped p+ regions to the first P-WELL, and a second input terminal supplies a voltage signal Vn through heavily doped n+ regions to the first N-WELL.

Figure 3A:
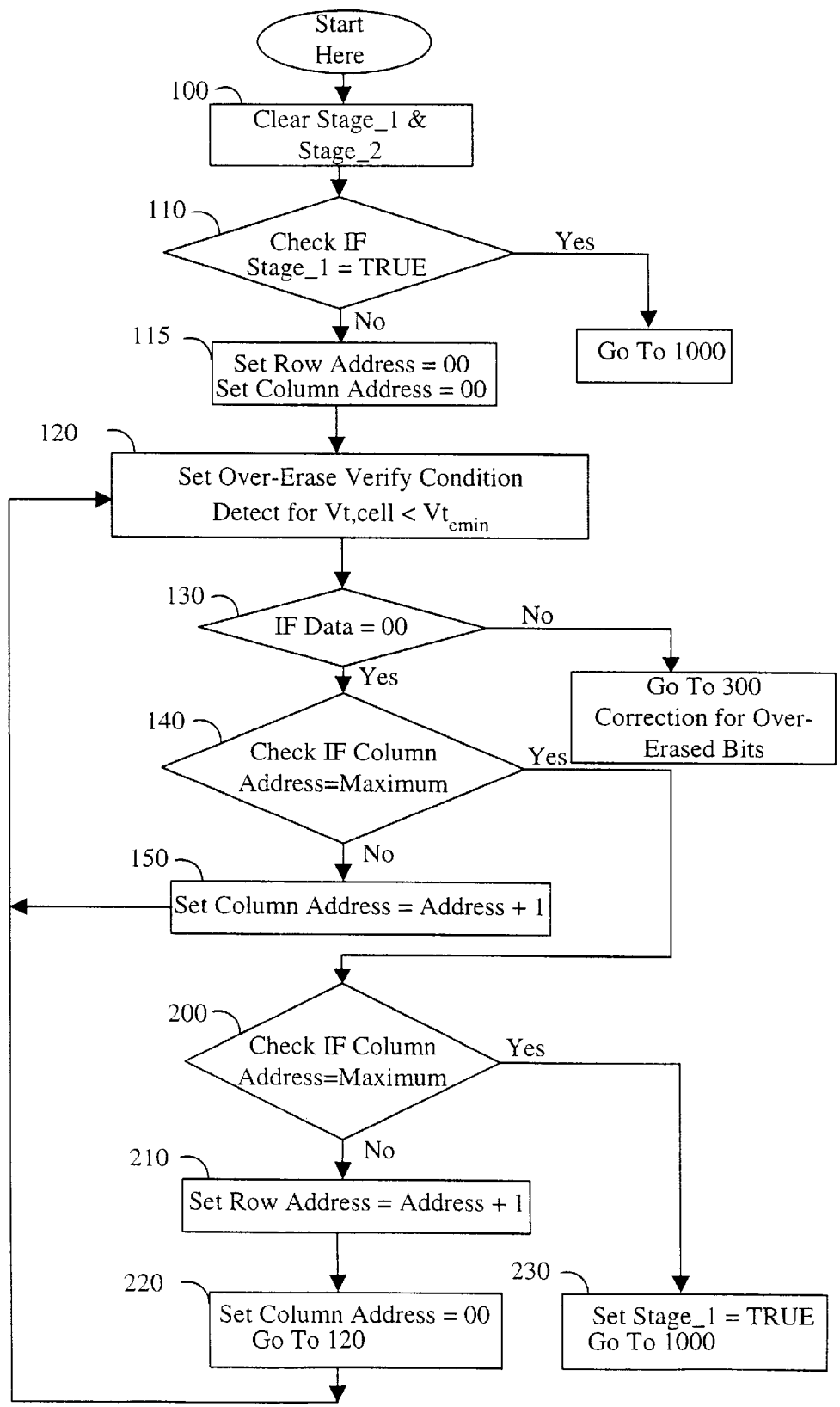
FIG. 3A is a flow chart diagram describing a sequence used in the present invention to detect over-erased cells in a flash EEPROM before any erase is performed.

Continuing with this summary overview, it can be seen that over-erased bits in a flash memory array are detected before erase takes place in the present invention in an over-erase detection routine as the flow chart depicts FIG. 3A. Once any over-erased bits are detected, correction to such over-erased bits is accomplished with an over-erase correction routine. Unlike the prior art, this over-erase correction mechanism does not place the core cell Vt into a highly or fully 'programmed' state in the flash memory array. Instead, the present invention only places over-erased bits in the flash memory into a core cell threshold voltage state in which the leakage current along a bit line is insignificant.

The second portion of the present invention generally provides a mechanism for "tightening" (i.e., making more uniformly close to a target threshold) Vt distribution of the cells after any erases. After each embedded erase of the flash memory array, a convergence cycle is utilized to automatically converge the erased memory array to a predefined core cell voltage Vt, which in a preferred embodiment is equal to $Vt_{emin}$. In this way, the core array is stressed globally to amend any core cells that may have been over-erased during the just completed erase cycle. This ensures that the erased core cell threshold Vt of any cell will never be below a pre-determined lower limit $Vt_{emin}$ for the said flash memory array.

Figure 1:
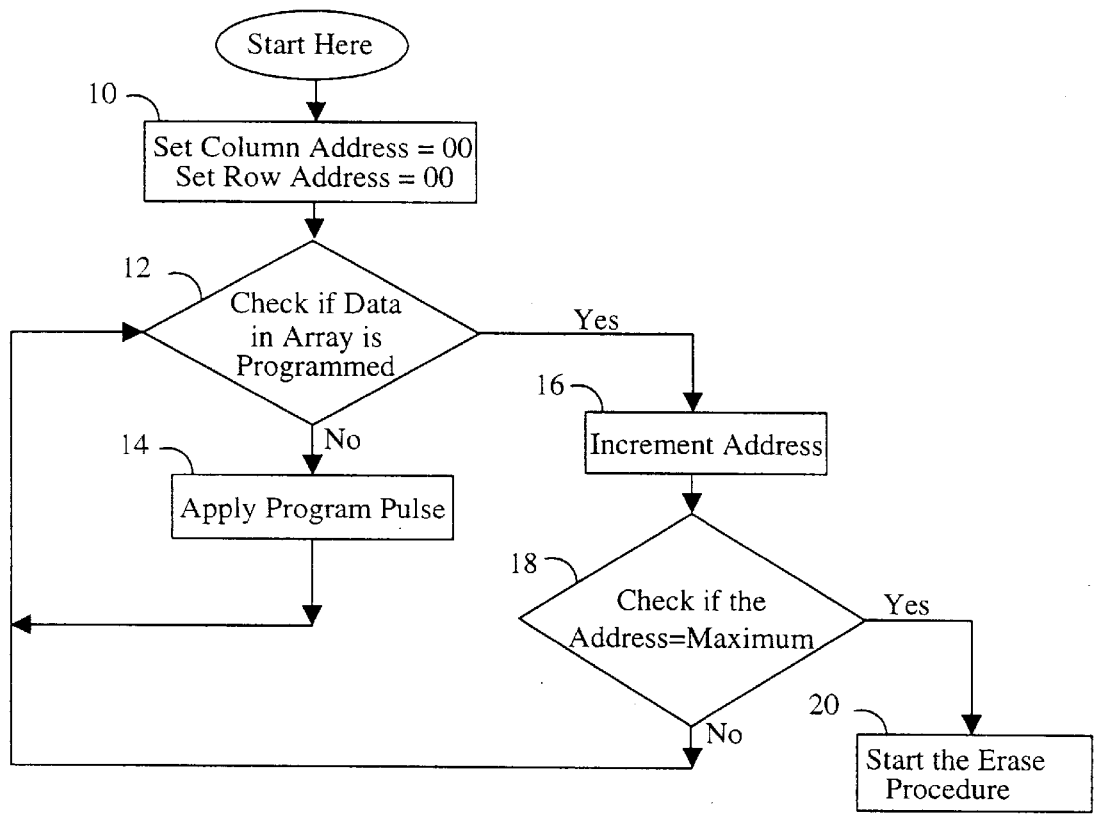
FIG. 1 is a flow chart describing pre-programming steps performed in a prior art scheme before each erase in a single transistor per cell flash EEPROM.

To better understand the present invention, a short description first follows of typical over-erase and under-erase detection and correction mechanisms used in the art. FIG. 1 illustrates a typical prior art mechanism for programming cells of a flash memory array. After an initialization step 10, all bytes in a flash memory array are first verified at step 12 to see if the data is programmed before an erase operation can take place in the flash memory array. If the cells are not already programmed with data, a program pulse is applied as indicated at step 14. If the cells at that particular location are already programmed, the next address is checked as shown at steps 16 and 18. This process is repeated until all bytes have been programmed, at which point the program routine exits at step 20.

Figure 2:
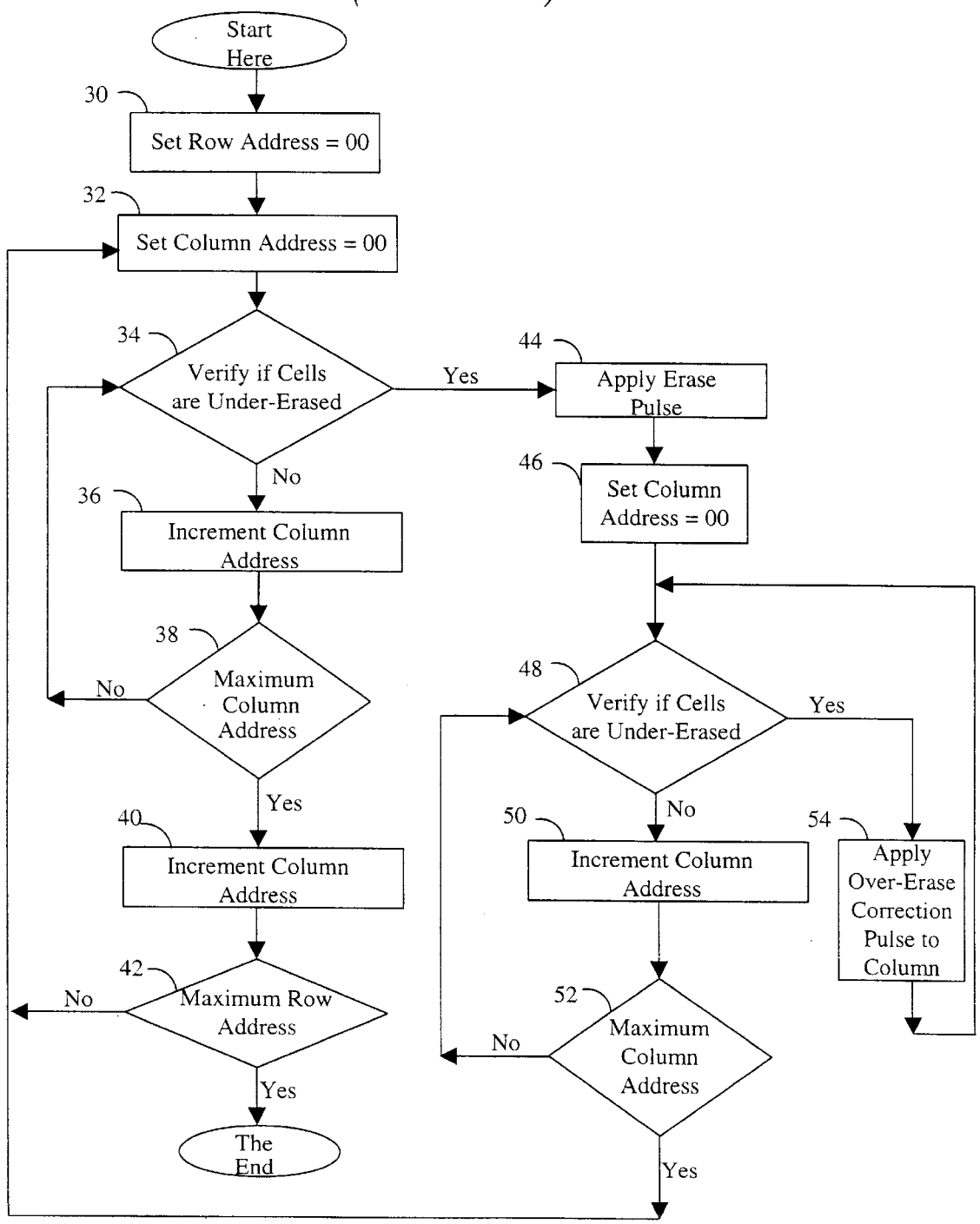
FIG. 2 is a flow chart depicting a prior art sequence for erasing a flash EEPROM.

FIG. 2 describes generally an erase process used in the prior art in which the flash memory array is erased only after all bytes have been pre-programmed. An address counter is initialized at steps 30 and 32. A check is made at step 34 to see if any cells are "under" erased, which from an operational perspective, is essentially a "programmed" condition. If the cell is not under-erased (programmed) a column address is incremented at step 36, and this loop continues until all the cells within a particular row are checked through step 38, at which point a row address pointer is incremented at step 40. If all the rows of the array have not been examined, the process loops back to step 32; otherwise, the program checking portion is completed and the process exits. In the event programmed cells are discovered (i.e., under-erased cells), an erase pulse is applied at step 44 to the entire array. Each column of the array is then checked, beginning at step 46 and then step 48 to see if any cell is "over" erased. If yes, an erase correction pulse is applied to that column at step 54, and the process loops back to step 48; otherwise, the process continues stepping through the array at steps 50 and 52 until all the cells have been examined for over-erasure.

As a first observation it will be noticed that in contrast to the prior art, the present invention does not require pre-programming of all bytes before an erase operation. Instead, as shown in the flow chart of FIG. 3A, the present invention first detects for over-erased bits before each and any erase operations. It should be noted that the routines below are typically implemented in conventional form as embedded executable routines stored in a program memory of an integrated circuit that is accessible by some form or controller (processor) onboard an actual device. Alternatively, they may be executed by an off-chip processor during a manufacturing stage for purposes of cycling and testing flash memory arrays using the processes below. The particular manifestation of the control circuit executing the routines below is not critical, and the present invention is by no means limited to any specific physical embodiment.

Initially, therefore, the present invention conditions the memory cells of a flash array in the following fashion: first, an over-erase detection routine checks at 110 to see if a prior iteration of this same routine has already been completed; if so, it jumps to step 1000 which is an under-erase detection routine discussed more fully below. Assuming the over-erase detection routine has not been previously completed, step 120 begins the process of checking the threshold voltage of each cell in a specified row. At step 130, if any cells in a byte are over erased for any reason, the data for such byte will not read as '00' and the routine jumps to step 300 which is discussed in connection with FIG. 3B. Otherwise, the routine proceeds to steps 140 and 150 to examine the next address. If all column addresses have been verified as in step 140, the routine then determines if all the rows have been verified in step 200. If not, all remaining column addresses in the next row in step 210 and step 220 are then checked. This process continues until all bytes in the array have been completely verified for any over-erased cells and the routine exits at 230.

Figure 3B:
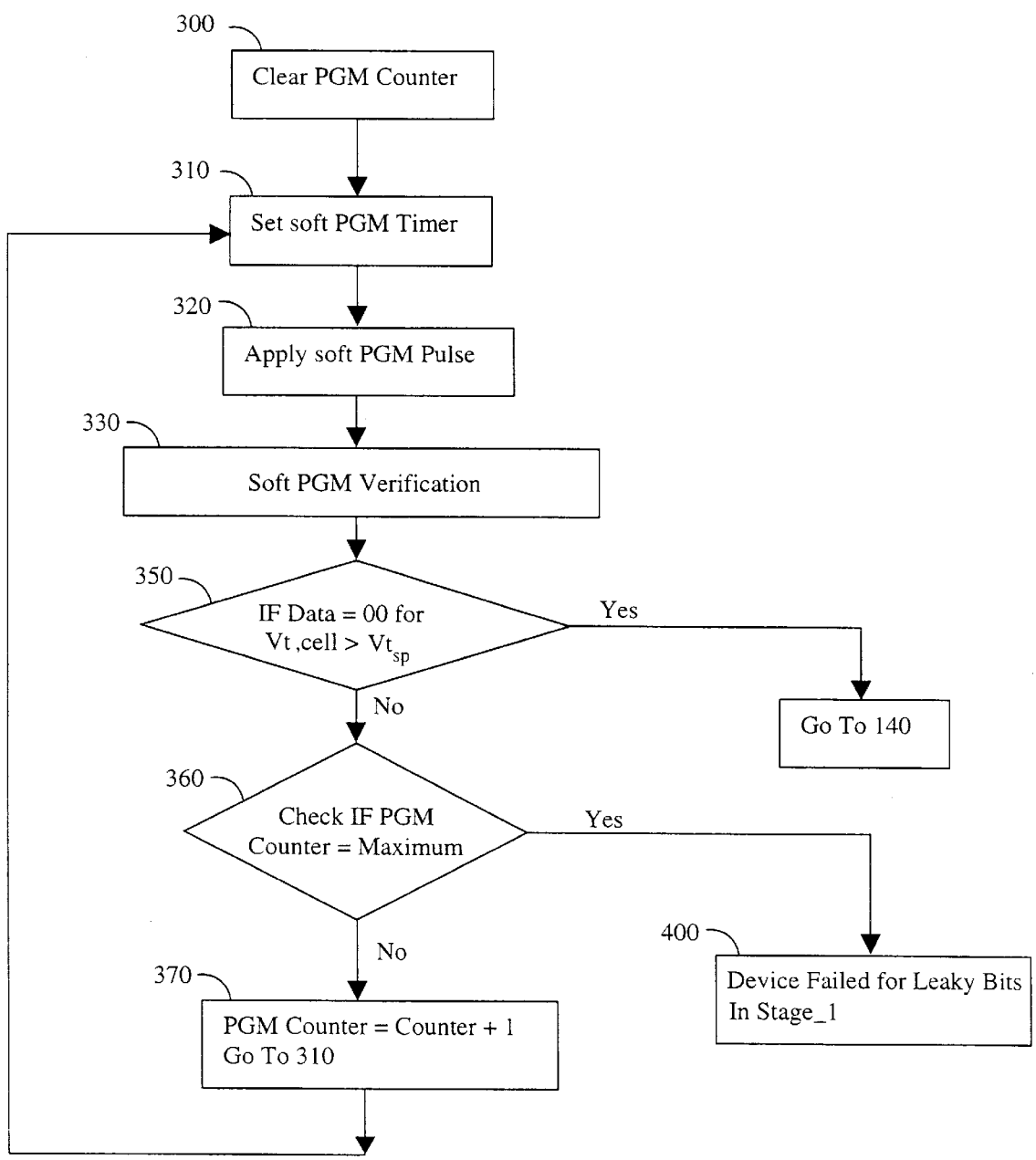
FIG. 3B is a flow chart diagram describing a process used in the present invention to correct detected over-erased memory cells before an erase operation is performed.

If as a result of the verification above any over-erased bits are identified, an over-erase correction process is then applied only to such over erased bits as shown in the flow chart of FIG. 3B before each erase actually starts. An adjustable program counter is cleared at step 300, and a soft program timer is set at step 310 as controls for this particular routine. These variables, in other words, can be adjusted as necessary based on system considerations so that excessive time is not devoted to overly leaky bits that are not fixable. After receiving a soft program pulse in step 320, any over erased bits are verified in step 330 to see if they can pass the current leakage check in step 350. After the bits have passed the soft program verification, the over-erase correction routine returns control to the over-erase detection routine at step 140 of FIG. 3A for the next address for the detection of any other over erased bits. However, if the bits do not pass the soft program verification, the correction method is applied again until the over erased bits can pass the leakage check at 350, or alternatively, there is an indication to the system at step 400 that the bits cannot be fixed. In such cases, absent some form of redundancy repair (which can be implemented under certain circumstances in limited environments using known techniques) the device is identified as failing. The soft program pulse at step 320 is not a typical "program" pulse as conventionally used in the art. Instead, a threshold adjustment voltage signal is used to adjust threshold voltages of any over-erased cells, so that threshold voltages for any of such cells are distributed between $Vt_{emin}$ and $Vt_{emax}$, where $Vt_{emax}$ is a maximum and $Vt_{emin}$ a minimum target threshold voltage value for a cell in an erased state. [In the preferred embodiment we have discovered that a signal of approximate duration 0.01 msec, and with an amplitude of 5 volts is best used for a block of 8 cells having an approximate floating gate size of 0.4 $\mu$m by 0.4 $\mu$m. This signal is applied to the control gate of the cell while the bitlines are biased at 5 volts. It should be noted, however that the particular implementation of this soft program pulse will vary significantly according to the specifics of the device in question, and the present invention is by no means limited by the particulars of this soft program pulse. Therefore the soft program pulse $Vt_{sp}$ is applied, on a cell by cell as needed basis, to push the threshold voltage of such cell into a region bounded by $Vt_{emin}$ and $Vt_{emax}$.

Figure 4A:
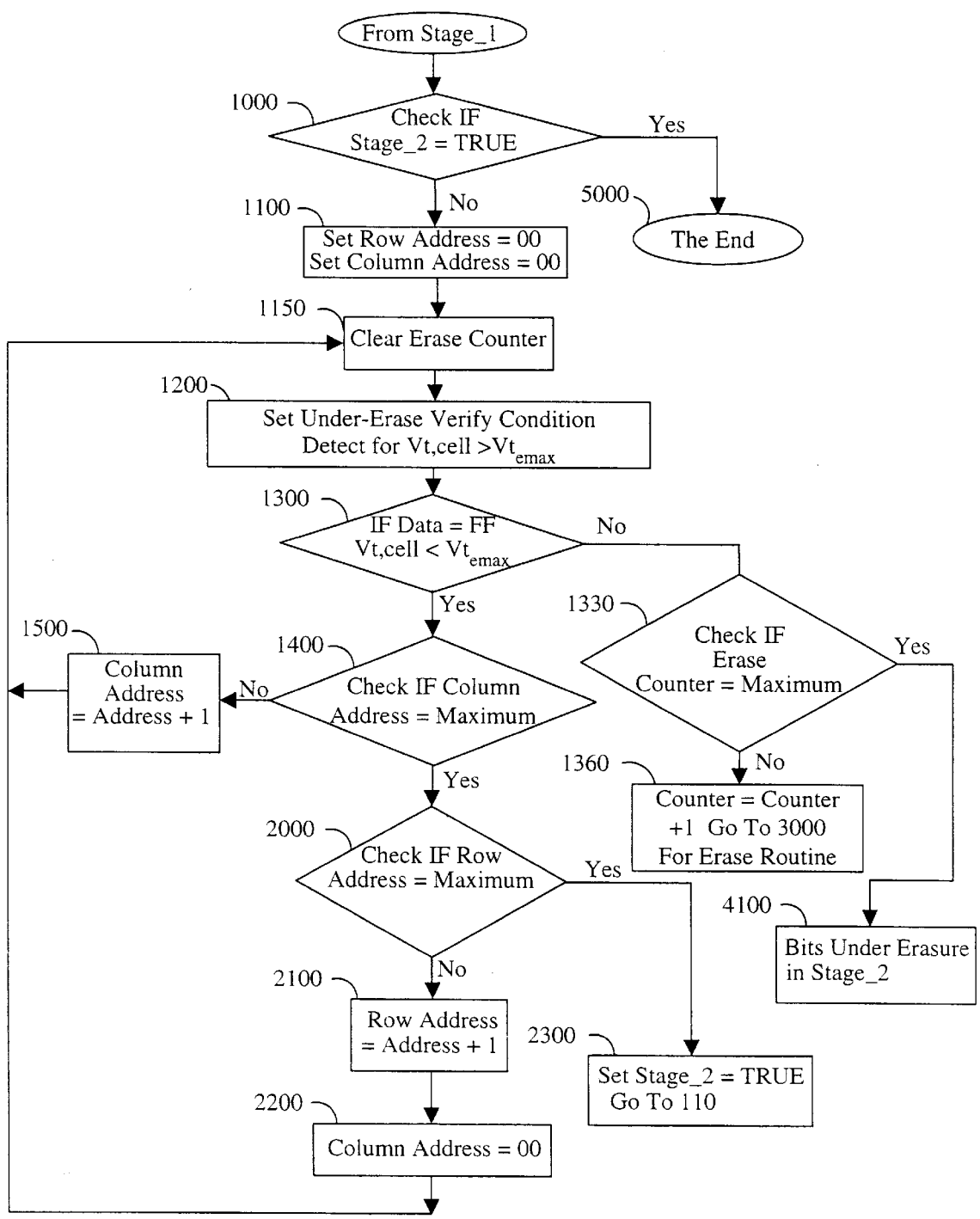
FIG. 4A is a flow chart describing a method used in the present invention to provide means for the detection of under-erased memory cells in the flash EEPROM.
Figure 5:
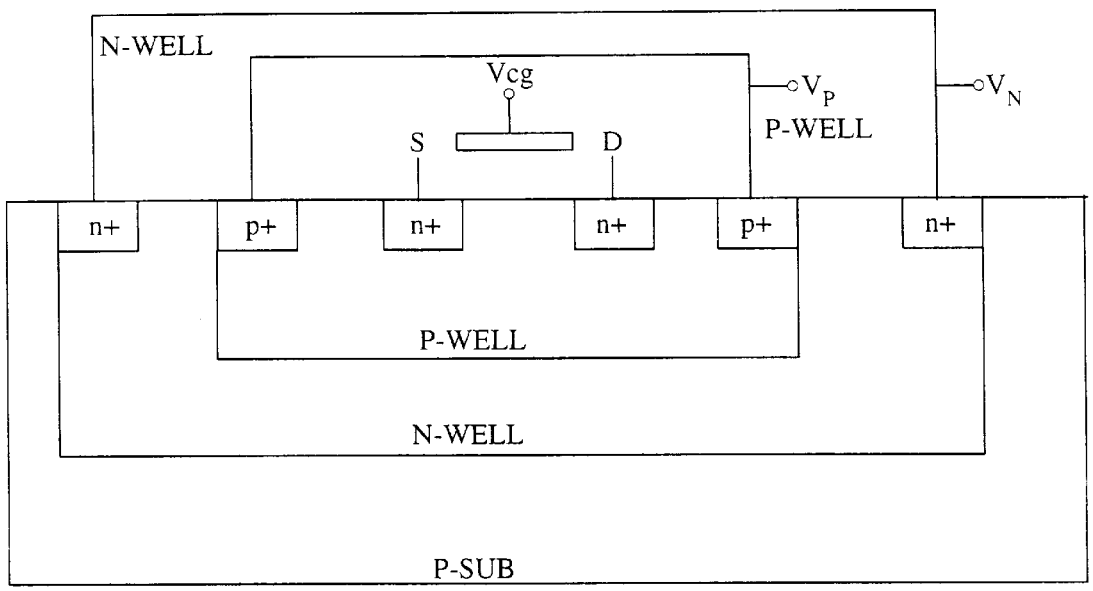
FIG. 5 is a cross sectional view of a typical flash core cell.

If no further over-erased bits are detected, then the flash memory array will be checked for under-erasure in FIG. 4A before each erase. An erase takes place in the present invention only if under-erased bits are detected. Otherwise, no further erase is performed on the flash memory array. As will be appreciated by those skilled in the art. this is significantly different than in the prior art where all bytes are pre-programmed before each erase. Mandatory programming before erase has a number of disadvantages, including the fact that it takes extra time, requires extra power, excessively and unnecessarily stresses the physical structure of the cells, and disturbs the threshold voltages of such cells. Moreover, even if a single byte needs to be altered, it is necessary to reprogram an entire device, which is very inefficient. Mandatory programming before erase is also inefficient in that there may not actually be any under-erased cells in the array, and thus there may be no reason for an erase as well. If, however, one practices the prior art and programs the array indiscriminately, there will definitely be under-erased cells that need to be erased even if there were none previously. It can be seen, therefore, that the present invention also saves wear and tear on the memory cells for the reason that unnecessary erasures are also prevented in many cases.

Figure 4B:
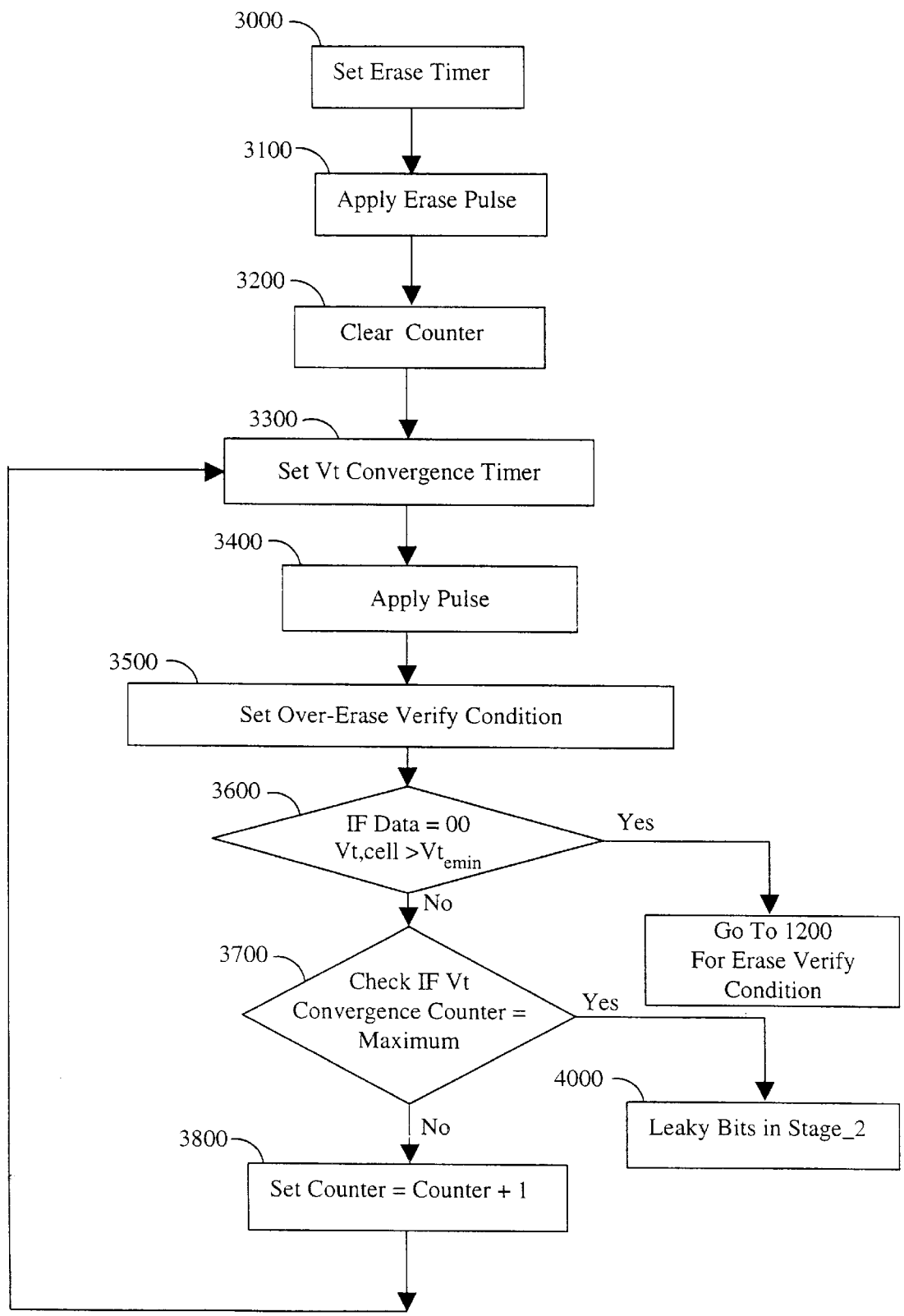
FIG. 4B is another flow chart illustrating a method used in the present invention to tighten erased memory cell threshold voltages in a flash EEPROM.

In the present invention, therefore, an under-erase detection routine is executed prior to any erase, as depicted generally in FIG. 4A. After the over-erase detection and over-erase correction routines are completed as noted above, the under-erase detection routine begins at step 1000, where it first verifies whether the routine has previously completed; if so, it exits at 5000. Otherwise, step 1100 sets up appropriate address counters to check every bit in the array. At 1150 an erase counter is cleared; the erase counter is analogous to the PGM counter in the over-erase correction routine in that it can be used to control the degree of effort made by the present invention to correct a stubborn bit. At step 1200 the flash memory array is checked to see if any under erased bits exist. If any bits in the memory array are under erased, the data for such byte would not be read as 'FF' in step 1300. In the event under-erased bits are detected (and only when this is the case) an under-erase correction routine is executed as shown in FIG. 4B and discussed further below. Otherwise, the present routine checks for the end of the column addresses at step 1400, and then proceeds as necessary to the next column address in step 1500 to detect for any other under erased bits again in step 1200. After all column addresses on one row have been completely checked, detection for under-erased bits continues on the next row in step 2000 and step 2100 beginning with column 00 at step 2200. The process of detecting under-erased bits continues until all bytes in the flash memory array pass the verification as in step 2300, or alternatively, if certain stubborn bits cannot be corrected. the erase counter reaches its maximum value at step 1330 and the routine notifies the controller at step 4100 of this fact. Again, in some instances it is possible to correct such stubborn bits, but such discussion is not germane to the present invention.

Figure 6:
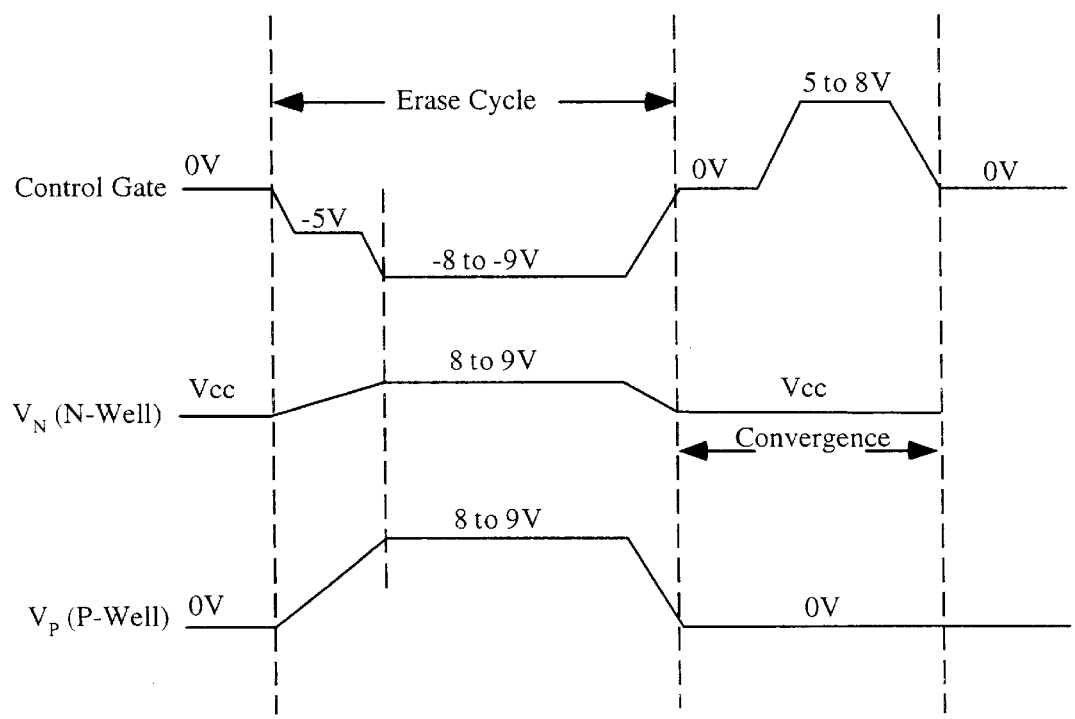
FIG. 6 is a diagram depicting the timing of the various voltages as applied by the present invention during a flash EEPROM embedded erase process.

The under-erase detection routine then returns control back to step 110 (FIG. 3A) where detection begins again for over-erased bits which may have been caused by an under-erase correction procedure as described in FIG. 4B. In FIG. 4B this routine proceeds as follows: an erase timer is set at step 3000 and an erase pulse is applied to the flash memory array at step 3100. After the erase pulse has been applied at step 3100, a unique convergence procedure is initiated at step 3200 for tightening (narrowing) threshold to voltage (Vt) distributions of the erased cells. A timing diagram in FIG. 6 shows that the erase pulse is applied globally to the array during a first erase cycle After this, a second convergence cycle occurs as shown there, with voltages and timing as noted. The convergence cycle is controllable by a number of parameters. First, as noted at step 3200, a convergence counter, which can be set by the controller, is reset prior to Vt adjustments. A convergence timer 3300 determines the length of the convergence cycle shown in FIG. 6, and, again, is programmable and manipulable by a control circuit. At step 3400 the signal voltages shown in the convergence cycle in FIG. 6 are applied in the manner shown to input terminals $V_P$ and $V_N$. The amplitude, frequency and duration of this voltage will vary from array to array, and should be determined by individual characteristics of such arrays so that the threshold voltage distributions are narrowed as much as possible to converge on a target threshold. In general, the goal of the convergence procedure is to set the threshold voltages to a value $Vt_{cp}$, where again, in a preferred embodiment, $Vt_{cp}=Vt_{emin}$. Unlike the soft program pulse described above, however, the convergence cycle applies the convergence signals (both soft erase and soft program) to all cells in the array, and not on a cell by cell basis.

Verification of potential over-erasure after each such soft convergence erase pulse is implemented in step 3500. If the bits are not over-erased, the data read in step 3600 should be '00' and verification of these same bits for under-erase would then take place beginning with step 1200 in FIG. 4A. If the data of the bits is not '00', further compression or tightening of the erased Vt distribution is effectuated as shown in step 3700, step 3800 and then back again to step 3400. This procedure continues until no more over-erased bits are detected through the method of globally tightening the erased Vt distribution, or until the routine drops out at 4000 because the bits in question are too leaky, and therefore cannot be easily corrected.

Figure 1B:
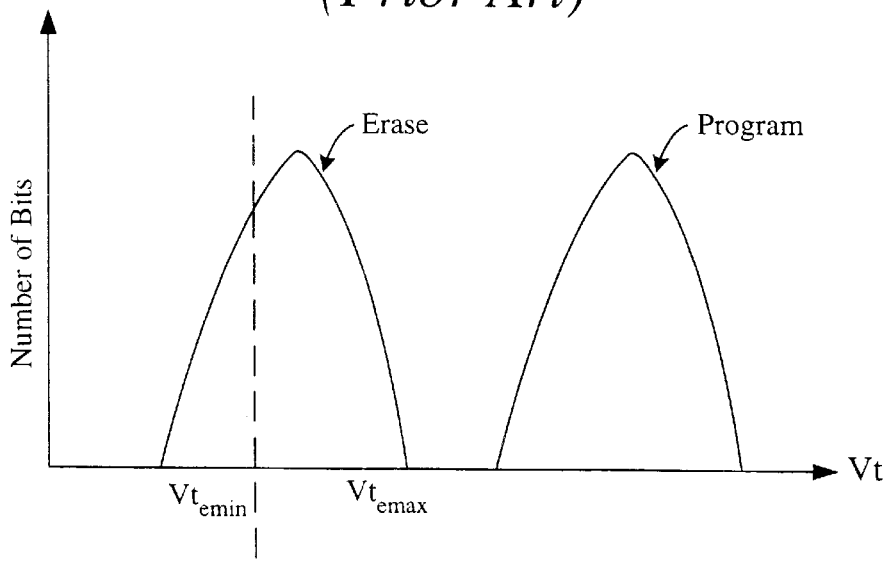
FIG. 1B is a graphical chart illustrating voltage threshold distributions for cells in a typical prior art memory cell array.

Based on theoretical observations, simulations and experimental data, applicants believe that the aforementioned convergence cycle is extremely advantageous for adjusting threshold voltages of flash memory cells. This conclusion is based further on the applicants' observation that a soft erase pulse applied to a set of cells will generally result in a larger downward change in threshold voltage for cells already having a higher Vt. Similarly, a soft program pulse applied to a set of cells will generally result in a larger upward change for cells having a lower Vt. In other words, in FIG. 1B, during a soft erase, cells at the high end (high Vt) of the distribution curve will tend to move proportionately lower in an absolute sense than cells at the low (low Vt) of the distribution curve. Correspondingly, during a soft program, cells at the low end (low Vt) of the distribution curve will tend to move proportionately higher in an absolute sense than cells at the high end (high Vt) of the distribution curve. It can be seen, therefore, that the convergence cycle has the effect of alternatively pulling the top and bottom edges of the voltage distributions closer together.

Again, since the present invention obviates the need to pre-program all bytes in a flash memory array before each erase, the present invention provides a very advantageous solution for low power applications in that power consumption to pre-program all bytes before each erase in the said flash memory array is saved. As a result, the norminal battery life in the low power applications is enhanced and prolonged. Pre-programming of all bytes before each erase in a flash memory array also exerts unnecessary electrical stress on the memory array which definitely results in the acceleration of device performance and reliability degradation.

It is evident that an integrated circuit can be manufactured using conventional processing means to include a control circuit configured in accordance with the teachings of the present invention. Such article of manufacture could include the inventive control circuit taken in combination with a typical flash memory cell array and conventional supporting peripheral circuitry (power supplies, address decoders, I/O data buffers, sense amplifiers, reference arrays, counters, timers, etc.). Such processing means and peripheral circuitry can be implemented using any of a number of structures and methods well-known in the art, and are therefore not described here in substantial detail. In any event, finished integrated circuit articles embodying the present invention will exhibit superior performance since better, more uniform voltage threshold populations will be implemented during the manufacturing process.

Figure 7:
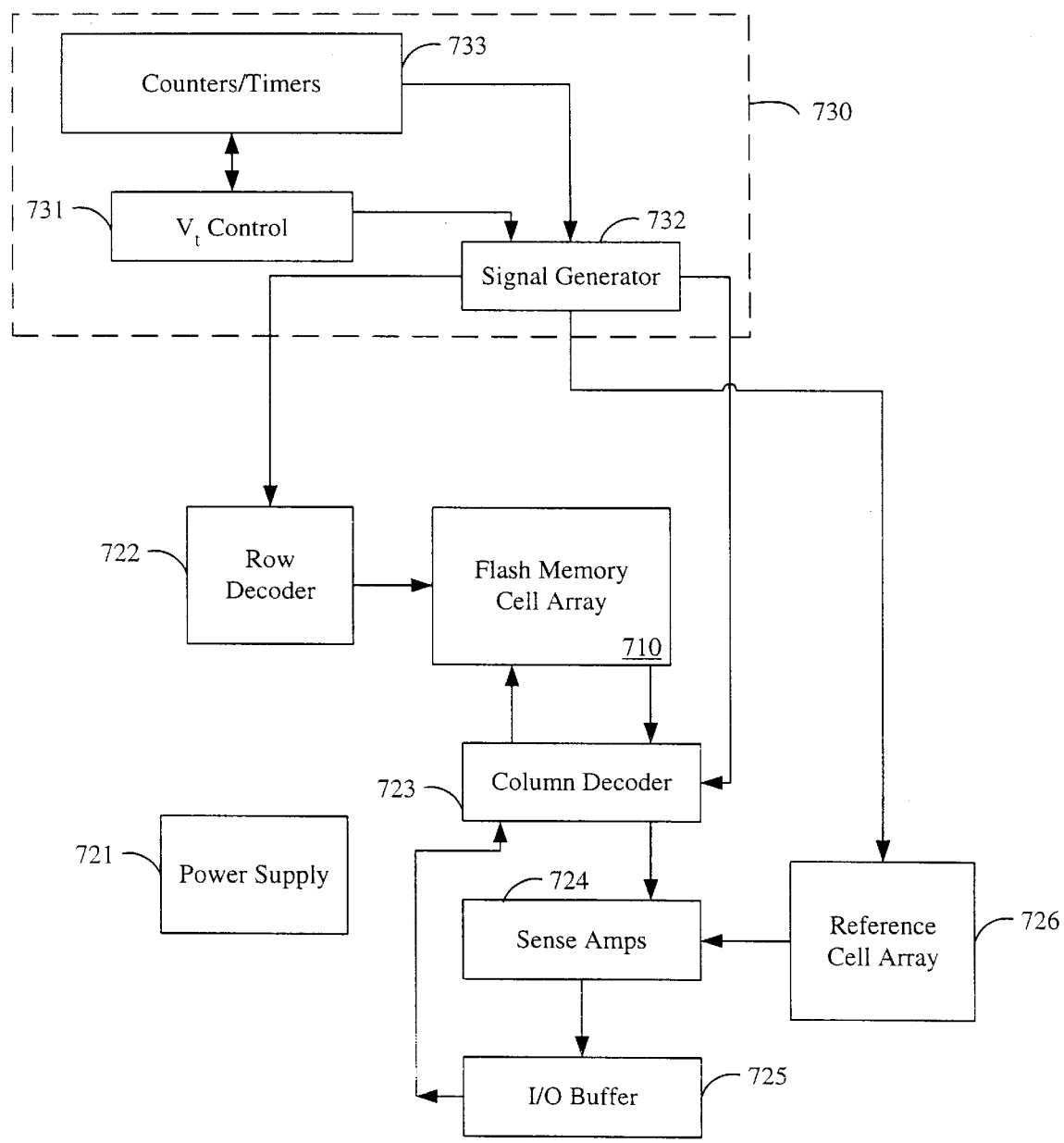
FIG. 7 illustrates an overview block diagram of an integrated circuit manufactured and configured in accordance with the teachings of the present invention.

Depicted in FIG. 7 is a simplified block diagram of a non-volatile memory integrated circuit 700 embodying the aforementioned controller circuit. Integrated circuit 700 includes an array of flash memory cells 710, and associated peripheral support circuitry, the latter including the conventional flash memory circuits mentioned above, such as power supply 721, address decoders 722 (row) and 723 (column), sense amps 724, I/O buffers 725, and reference cell array 726. Control circuit 730 includes suitable control logic in the form of threshold control circuit 731 implementing the various flash cell threshold control processes in the manner described above. To effectuate changes to such cell thresholds, such as by erase, program, soft program, or soft erase pulses, threshold control circuit 731 causes the various threshold adjustment signals to be generated by controlling signal generator circuit 732. These threshold adjustment signals are then applied by signal generator 732 to the individual cells and to the array in the manner shown in FIG. 6, including as discussed above, any conventional program/erase pulses as well as the soft program pulse and soft erase pulse. Programmable timers/counters 733 store any configured values specifying the duration and number of soft program/erase cycles as described above.

The above routines for implementing the inventive processes are provided merely by way of example, and are not intended to be limiting of the present invention in any respect. Other variations of the routines will become evident to those skilled in the art based on the teachings herein. Accordingly, it is intended that the all such alterations and modifications be included within the scope and spirit of the invention as defined by the following claims.

What is claimed is:

1. An integrated circuit comprising:

an array of flash memory cells, each of said cells having a conduction threshold voltage, a control gate, a floating gate, a source and a drain; and peripheral support circuitry coupled to such array, including a power supply, row and column address decoders, sense amplifiers, I/O buffers and a reference cell array; and a control circuit for adjusting the threshold voltages of the cells, the control circuit being configured such that:

(a) over-erased cells in the array can be detected, such over-erased cells having a threshold voltage below a threshold voltage $Vt_{emin}$;

(b) the threshold voltages of any over-erased cells can be adjusted by generating a threshold adjustment voltage signal, which adjustment signal is not applied to the entire flash memory cell array to adjust such thresholds so that they are approximately equal to a target threshold $Vt_{sp}$, where $Vt_{sp}$ has a value between $Vt_{emin}$ and $Vt_{emax}$, where $Vt_{emin}$ and $Vt_{emax}$ are minimum and maximum target threshold voltage values respectively for a cell in an erased state.

2. The integrated circuit of claim 1, wherein the control circuit is further configured such that it also detects the existence of any under-erased cells, such under-erased cells having a threshold voltage greater than $Vt_{emax}$.

3. The integrated circuit of claim 2, wherein the control circuit is further configured such that it applies an erase pulse to said array only if under-erased cells are detected.

4. The integrated circuit of claim 3, wherein the control circuit is further configured such that it corrects any new over-erased cells caused by the erase pulse by adjusting their thresholds with a soft program pulse so that they are distributed between $Vt_{emin}$ and $Vt_{emax}$.

5. The integrated circuit of claim 3, wherein the control circuit is further configured such that it applies an erase pulse to the entire array without first applying a program pulse immediately prior to such erase pulse.

6. The integrated circuit of claim 1, wherein the control circuit is configured for adjusting the threshold voltages of the cells using a convergence cycle, during which cycle soft program pulses applied to said array so that threshold voltages of cells in said array converge to a boundary set by $Vt_{emin}$ and $Vt_{emax}$.

7. A method of making a flash memory integrated circuit, said method including the steps of:

(a) providing an array of flash memory cells in said integrated circuit, each of said cells having a conduction threshold voltage, a control gate, a floating gate, a source and a drain; and (b) providing peripheral support circuitry in said integrated circuit for such array, including a power supply, row and column address decoders, sense amplifiers and a reference cell array; and (c) providing a control circuit in said integrated circuit for adjusting the threshold voltages of the cells, the control circuit being configured such that:

i) over-erased cells in the array can be detected, such over-erased cells having a threshold voltage below a threshold voltage $Vt_{emin}$, where $Vt_{emin}$ is a minimum target threshold value for a cell in an erased state; and ii) the threshold voltages of any over-erased cells can be adjusted by generating a threshold adjustment voltage, which adjustment signal is not applied to the entire flash memory cell array so that they are adjusted to be approximately equal to a threshold voltage $Vt_{sp}$, where $Vt_{emin}<=Vt_{sp}<=Vt_{emax}$, where $Vt_{emax}$ is a maximum target threshold voltage value for a cell in an erased state.

8. The method of claim 7, wherein the control circuit is further configured such that it also detects the existence of any under-erased cells, such under-erased cells having a threshold voltage greater than $Vt_{emax}$.

9. The method of claim 8, wherein the control circuit is further configured such that it applies an erase pulse to said array only if under-erased cells are detected.

10. The method of claim 9, wherein the control circuit is further configured such that it corrects any new over-erased cells caused by the erase pulse by adjusting their thresholds so that they are distributed between $Vt_{emin}$ and $Vt_{emax}$.

11. The method of claim 10, wherein the control circuit is further configured such that it applies an erase pulse to the entire array without first applying a program pulse immediately prior to such erase pulse.

12. An over-erase correction circuit for correcting over-erased memory cells in a flash memory cell array, said cells including a voltage threshold, said circuit including:

a control circuit for executing an over-erase detection routine and an over-erase correction routine, such that:

(i) the control circuit can detect during the over-erase detection routine any cells that have a threshold voltage below a threshold voltage $Vt_{emin}$, where $Vt_{emin}$ is a minimum target threshold value for a cell in an erased state the over-erase detection routine;

(ii) the control circuit can generate a threshold adjustment voltage signal, which adjustment signal is not applied to the entire flash memory cell array to adjust threshold voltages of any such over-erased cells, so that threshold voltages for any of such cells are made substantially equal to a target threshold $Vt_{sp}$, where $Vt_{emin}<=Vt_{sp}<=Vt_{emax}$, where $Vt_{emax}$ is a maximum target threshold voltage value for a cell in an erased state.

13. The circuit of claim 12, wherein the control circuit also can detect the existence of any under-erased cells during an under-erase routine, such under-erased cells having a threshold voltage greater than $Vt_{emax}$.

14. The circuit of claim 13, wherein the control circuit further can apply an erase pulse to said array if any under-erased cells are discovered during the under-erase routine.

15. The circuit of claim 14, wherein the control circuit can apply an erase pulse without first applying a program pulse immediately prior to the erase pulse.

16. A circuit for compressing a distribution of threshold voltages of flash memory cells in a flash memory cell array, said circuit including:

a signal generating circuit for generating an erase signal for erasing said cells in said array, and for generating threshold adjustment control signals, said erase signal being applied to the array without first applying a signal to program the array;

a control circuit for controlling the signal generating circuit and for executing a threshold adjustment routine, such that:

(a) after any erase signal is applied to said array, the threshold adjustment routine is executed, which routine determines if any flash cells have a sub-threshold voltage below a threshold voltage $Vt_{emin}$, where $Vt_{emin}$ is a minimum target threshold value for a cell in an erased state; and (b) if any cells have a threshold voltage below $Vt_{emin}$, the threshold adjustment control signal is applied to such cells to adjust the threshold of such cells to lie between $Vt_{emin}$ and $Vt_{emax}$, where $Vt_{emax}$ is a maximum target threshold voltage value for a cell in an erased state.

17. The circuit of claim 16 wherein the control circuit can also execute an over-erase routine for detecting the existence of any over-erased cells, such over-erased cells having a threshold voltage less than $Vt_{emin}$.

18. The circuit of claim 16, wherein the erase signal is generated only if any under-erased cells are detected.

19. The circuit of claim 18, wherein the erase signal is applied without first applying a program pulse immediately prior to the erase pulse.

20. The circuit of claim 17, wherein the control circuit generates a second threshold adjustment control signal for compressing the threshold voltage distribution for said cells if any cells are over-erased.

21. A circuit for erasing flash memory cells in a flash memory cell array, said circuit including:
   a signal generating circuit for generating an erase signal for erasing said cells in said array, and for generating threshold adjustment control signals;
   a control circuit for controlling the signal generating circuit and for executing a over-erase and under-erase routine, such that:
      (a) the erase signal is applied to said array only if the over-erase detection routine is completed, and only if the under-erase routine detects under-erased cells;
      (b) if the erase signal is applied, a convergence routine is executed, which routine:
         (i) determines if any flash cells have a sub-threshold voltage below a threshold voltage $Vt_{emin}$, or above $Vt_{emin}$, where $Vt_{emax}$, is a minimum target threshold value for a cell in an erased state, and where $Vt_{emax}$ is a maximum target threshold voltage value for a cell in an erased state; and
         (ii) if any cells are determined to have a threshold voltage below $Vt_{emin}$ during the convergence routine a first threshold adjustment control signal is applied only to said cells; and
         (iii) if any cells are determined to have a threshold voltage above $Vt_{emax}$ during the convergence routine a second threshold adjustment control signal is applied to said array;
   wherein by adjusting threshold voltage values of both over-erased and under-erased cells, the threshold of such cells in said array is controlled to lie between $Vt_{emin}$ and $Vt_{emax}$.

22. The circuit of claim 21, wherein the first threshold adjustment control signal is a soft program pulse, and the second threshold adjustment control signal is a global threshold voltage convergence.

23. The circuit of claim 21, further including wherein the control circuit controls an over-erase detection and correction procedure for applying a soft program pulse to correct over-erased cells in said array.

24. A circuit for correcting threshold voltage values for over-erased memory cells in a flash memory cell array, said circuit including:
   (a) control logic for detecting the existence of any over-erased cells, said over-erased cells having a threshold voltage below a threshold voltage $Vt_{emin}$, where $V_{emin}$ is a minimum target threshold value for a cell in an erased state;
   (b) signal generating logic for adjusting said threshold voltages of said over-erased cells by generating a threshold adjustment voltage signal, said adjustment voltage signal being configured to be applied to such over-erased cells in order to set threshold voltages for over-erased cells to a value between $Vt_{emin}$ and $Vt_{emax}$, where $Vt_{emax}$ is a maximum target threshold value for a cell in an erased state; and
   wherein said threshold adjustment voltage signal is not applied to all of such cells in such array.

25. The circuit of claim 24, wherein said threshold adjustment signal can be applied repeatedly to such cell in such array until such cell has a threshold voltage between $Vt_{emin}$ and $Vt_{emax}$ or until such cell is determined to be not fixable.

26. The circuit of claim 24, wherein said threshold adjustment signal can be applied to such over-erased cell for a maximum number of times based on a value set in a programmable counter.

27. The circuit of claim 24, wherein said threshold adjustment signal can be applied to such over-erased cell for a signal duration based on a value set in a programmable timer.

28. The circuit of claim 24, wherein said threshold adjustment signal is applied to a control gate of such cell, and has a value of less than approximately 5 volts.

29. A circuit for erasing memory cells in a flash memory cell array, said circuit including:
   a control circuit for executing erase and program operations for the flash memory cells, such that:
      (a) an erase pulse can be applied to the array during an erase operation; and
      (b) threshold voltages of such cells can be adjusted after such erase operation with a threshold adjustment signal, so that such erased cells have a threshold voltage above a threshold voltage $Vt_{emin}$, where $Vt_{emin}$ is a minimum target threshold value for a cell in an erased state, and such cells further have a threshold voltage value below $Vt_{emax}$, where $Vt_{emax}$ is a maximum target threshold voltage value for a cell in an erased state; and
   wherein such array can be erased without first pre-programming such cells to a program threshold voltage value $Vt_{pmin}$, where $Vt_{pmin}$ is a minimum program threshold value for such array, and $Vt_{pmin} > Vt_{emax}$.

30. The circuit of claim 29, wherein said threshold adjustment signal includes both a soft program and soft erase signal applied that can be applied to the array as needed to adjust the threshold voltage values to a target erase value $Vt_{sp}$.

31. The circuit of claim 30, wherein any over-erased cells can be detected and corrected on a cell-by-cell basis.

32. The circuit of claim 29, wherein prior to applying said erase pulse, a determination is first made concerning whether any cells in such array are under-erased.

33. The circuit of claim 29, wherein said threshold adjustment signal can be applied repeatedly to such array until such cells have a threshold voltage between $Vt_{emin}$ and $Vt_{emax}$ or until one or more cells are determined to be not fixable.

34. The circuit of claim 29, wherein said threshold adjustment signal can applied to such array for a maximum number of times based on a value set in a programmable counter.

35. The circuit of claim 29, wherein said threshold adjustment signal can be applied to such over-erased cell for a signal duration based on a value set in a programmable timer.

36. A circuit for controlling voltage threshold distributions of memory cells in a flash memory cell array, said circuit including:
  a control circuit coupled to said array, which control circuit is configured such that
    (a) said control circuit can detect any over-erased cells; and
    (b) said control circuit can correct any such over-erased cells; and
    (c) said control circuit can detect any under-erased cells; and
    (d) said control circuit can control an erase pulse to be applied to the array during an erase operation;
  wherein such erase pulse can be applied without first pre-programming such cells to a program threshold voltage value $Vt_{pmin}$, where $Vt_{pmin}$ is a minimum program threshold value for such array, and $Vt_{pmin} > Vt_{emax}$, where $Vt_{emax}$ is a maximum target threshold voltage value for a cell in an erased state.

37. The circuit of claim 36 said control circuit further being configured to adjust threshold voltages of such cells after such erase operation, so that such erased cells have a threshold voltage above a threshold voltage $Vt_{emin}$, where $Vt_{emin}$ is a minimum target threshold value for a cell in an erased state, and such cells further have a threshold voltage value below $Vt_{emax}$.

38. The circuit of claim 37, wherein soft program and soft erase signals are applied under control of said control circuit to the array as needed to adjust the threshold voltage values to a target erase value $Vt_{sp}$.

39. The circuit of claim 38, wherein said soft program and soft erase signals can be applied repeatedly to such array until such cells have a threshold voltage between $Vt_{emin}$ and $Vt_{emax}$ or until one or more cells are determined to be not fixable.

40. A circuit for converging voltage thresholds of memory cells in a flash memory cell array, including:
  a control circuit coupled to the array, which control circuit is configured such that:
    (a) said control circuit can detect the existence of any over-erased cells, such over-erased cells having a threshold voltage below a threshold voltage $V_{emax}$, where $Vt_{emin}$ is a minimum target threshold value for a cell in an erased state; and
    (b) said control circuit can detect the existence of any under-erased cells, such under-erased cells having a threshold voltage above a threshold voltage $Vt_{emax}$, where $Vt_{emax}$ is a maximum target threshold value for a cell in an erased state; and
    (c) said control circuit can control generation of a first type of threshold adjustment voltage signal to adjust threshold voltages of any over-erased cells; and
    (d) said control circuit can control generation of a second type of threshold adjustment voltage signal to adjust threshold voltages of any under-erased cells;
  wherein said control circuit can cause threshold voltages for such cells to converge to a value between $Vt_{emin}$ and $Vt_{emax}$ using said first and second types of threshold adjustment signals.

41. The circuit of claim 40, wherein said first and second threshold adjustment signals can be applied repeatedly by such circuit until each cell has a threshold voltage between $Vt_{emin}$ and $Vt_{emax}$ or until such array is determined to be not fixable.

42. The circuit of claim 40, wherein said first and second threshold adjustment signals can be applied to such array for a maximum number of times based on a value set in a programmable program counter.

43. The circuit of claim 40 wherein said first and second threshold adjustment signals can be applied to such array for a signal duration based on a value set in a programmable timer.

44. A circuit for converging voltage thresholds of memory cells in a flash memory cell array, the circuit including:
  a control circuit coupled to the array, said control circuit being configured such that
    (a) said control circuit can cause the memory cells to be erased using an erase pulse;
    (b) said control circuit can detect the existence of any over-erased cells caused by such erase pulse, such over-erased cells having a threshold voltage below a threshold voltage $Vt_{emin}$, where $Vt_{emin}$ is a minimum target threshold value for a cell in an erased state;
    (c) said control circuit can cause a soft program signal to be applied to such array when any over-erased cells are detected;
    (d) said control circuit can detect the existence of any under-erased cells, such under-erased cells having a threshold voltage above a threshold voltage $Vt_{emax}$, where $Vt_{emax}$ is a maximum target threshold value for a cell in an erased state;
    (e) said control circuit can cause a soft erase signal to be applied to such array when any under-erased cells are detected;
  wherein threshold voltages for such cells can be adjusted with said soft program and soft erase signals to converge to a value between $Vt_{emin}$ and $Vt_{emax}$.

45. The circuit of claim 44, wherein said cells can be erased without first being pre-programmed.

46. The circuit of claim 44, further wherein said control circuit determines whether any cells in such array are under-erased before causing said erase pulse to be applied.

47. The circuit of claim 44, further wherein said control circuit also is configured to detect the existence of any over-erased cells, and can adjust threshold voltages in the array during a convergence cycle as necessary to correct such over-erased cells.

48. The circuit of claim 44, wherein the soft erase pulse is applied without first applying a soft program pulse prior to the soft erase pulse.

* * * * *